US006654237B1

United States Patent
Lee

(10) Patent No.: US 6,654,237 B1
(45) Date of Patent: Nov. 25, 2003

(54) ELECTRICAL DEVICE AND STAND FOOT THEREFOR

(75) Inventor: Kuoshao Lee, Taipei (TW)

(73) Assignee: Taiwan TriGem Information Co., Ltd., Taipei (TW)

( * ) Notice: Subject to any disclaimer, the term of this patent is extended or adjusted under 35 U.S.C. 154(b) by 0 days.

(21) Appl. No.: 10/279,856

(22) Filed: Oct. 25, 2002

(51) Int. Cl.[7] .................................................. G06F 1/16
(52) U.S. Cl. ...................... 361/683; 361/679; 361/681; 361/686
(58) Field of Search ............................... 361/679–681, 361/683, 686

(56) References Cited

U.S. PATENT DOCUMENTS

| 5,375,076 A | * | 12/1994 | Goodrich et al. | ........ 364/708.1 |
| 5,627,450 A | * | 5/1997 | Ryan et al. | .................... 320/15 |
| 5,949,643 A | * | 9/1999 | Batio | ......................... 361/681 |

* cited by examiner

Primary Examiner—Darren Schuberg
Assistant Examiner—Yean Hsi Chang
(74) Attorney, Agent, or Firm—Birch, Stewart, Kolasch & Birch, LLP

(57) ABSTRACT

An electrical device includes an electrical device body, a stand foot component and a resilient member. The electrical device body has a stand foot holder. The stand foot holder has two opposite sides each formed with a first pivotal portion. The stand foot holder further has a first slide-connecting portion between the first pivotal portions. A concave portion is formed in the first slide-connecting portion. The stand foot component is mounted in the stand foot holder and has two opposite sides each formed with a second pivotal portion pivotally connected with the first pivotal portion. A second slide-connecting portion, which may slide relative to the first slide-connecting portion, is formed between the second pivotal portions. A convex portion is formed in the second slide-connecting portion. When the stand foot component is held in the stand foot holder, the convex portion sinks into the concave portion. The resilient member is mounted between one of the first pivotal portions and its corresponding second pivotal portion. When the stand foot component is pivotally rotated relative to the electrical device body, the convex portion of the stand foot component is exposed from the concave portion, and the stand foot component slides under an elastic force of the resilient member, and the convex portion of the stand foot component is stopped at one side edge of the first slide-connecting portion, so that the stand foot component may stand up. In addition, a stand foot for an electrical device is also provided.

20 Claims, 8 Drawing Sheets

ELECTRICAL DEVICE AND STAND FOOT THEREFOR

BACKGROUND OF THE INVENTION

1. Field of the Invention

The invention relates to a stand foot, and in particular to an electrical device and a stand foot for the electrical device.

2. Description of the Related Art

In general, one or more than one stand foot is mounted to a housing of an electrical device in order to facilitate the inclination adjustment of the device during usage. The electrical device with stand foots includes a notebook computer, a computer keyboard, and the like.

There are substantially two methods for assembling the stand foot. One of the methods is to directly mount the stand foot onto a body or casing of an electrical device, while the other method is to form the stand foot as a single separable mechanism (hereinafter referred to as a stand foot for an electrical device) and then to mount the stand foot onto the electrical device. Taking the notebook computer as an example, a stand foot may be directly mounted onto the casing of the notebook computer. Alternatively, the stand foot may be assembled on a stand foot body such as a battery cap, and then the stand foot body may be assembled with the notebook computer casing to provide the function of the stand foot for the notebook computer.

Referring to FIG. 1, a conventional stand foot I for an electrical device mainly includes a stand foot body 11 and a stand foot component 12. In a notebook computer, the stand foot body 11 may be a battery cap having a stand foot holder 111. Two first pivotal portions 112 are provided at two opposite sides of the stand foot holder 111, respectively. A first slide-connecting portion 113 is formed between the first pivotal portions 112. The first slide-connecting portion 113 is formed with at least one concave portion 114. As shown in FIG. 2, the stand foot component 12 is mounted in the stand foot holder 111. Two second pivotal portions 121 are provided at two corresponding sides of the stand foot component 12, respectively. The second pivotal portions 121 are pivotally connected with the first pivotal portions 112, respectively. A second slide-connecting portion 122, which may contact the first slide-connecting portion and slide relative to the first slide-connecting portion, is formed between the second pivotal portions 121. The second slide-connecting portion 122 is formed with at least one convex portion 123. In addition, two notches 124 are formed between the second pivotal portions 121 and the second slide-connecting portion 122, respectively, so that an external force may be applied to force the second pivotal portions 121 to shrink toward the second slide-connecting portions 122. Accordingly, the stand foot component 12 may be received within the stand foot holder 111. Then, the second pivotal portions 121 may be pivotally connected with the first pivotal portions 112 by the recovery force of the second pivotal portions 121, respectively.

In the above-mentioned structure of the stand foot 1, the stand foot component 12 is only pivotally connected with the first pivotal portions 112 of the stand foot body 11 under the recovery force of the second pivotal portions 121, and is only forced against the side edge 1141 of the concave portion 114 by the convex portion 123. Consequently, when an external force F does not exert on the stand foot component 12, the convex portion 123 of the stand foot component 12 may not effectively contact the side edge 1141, thereby causing the stand foot component 12 to swing (as shown in the dashed line in FIG. 2). Furthermore, the convex portion 123 may completely slide into the concave portion 114, and the stand foot component 12 may sink into the stand foot holder 111 accordingly, thereby causing inconvenience for users. In addition, since the stand foot component 12 is pivotally connected with the first pivotal portions 112 of the stand foot body 11 by only the recovery force of the second pivotal portions 121, which may be relatively weakened after a period of time, the stand foot component 12 may be easily separated. That is, the stand foot component 12 may not be easily held.

Although a separable stand foot is described as an example of the conventional stand foot 1, another kind of stand foot that is directly mounted within an electrical device also has the same drawbacks.

In view of the above-mentioned problems, it is an important object of the invention to provide an electrical device having a stand foot that may stand up reliably and may be easily held, and a stand foot having the above-mentioned functions for an electrical device.

SUMMARY OF THE INVENTION

In view of the above-mentioned problems, it is an important objective of the invention to provide an electrical device having a stand foot that may stand up reliably and may be easily held.

Another objective of the invention is to provide a stand foot having the above-mentioned functions for an electrical device.

To achieve the above-mentioned objectives, the electrical device of the invention utilizes the elastic force supplied from the resilient member to make the stand foot component slide under the elastic force of the resilient member. Consequently, the convex portions formed on the stand foot component may reliably function as stoppers so that the stand foot component may reliably stand up. In addition, the electrical device of the invention functions by compressing the resilient member to make the convex portions of the stand foot component reliably engage with and stop at the concave portions of the electrical device body. Accordingly, the stand foot component may be reliably stored or held.

In addition, the stand foot for an electrical device of the invention utilizes the elastic force supplied from the resilient member to make the stand foot component slide under the elastic force of the resilient member. Consequently, the convex portions formed on the stand foot component may reliably function as stoppers so that the stand foot component may reliably stand up. In addition, the stand foot for the electrical device of the invention functions by compressing the resilient member to make the convex portions of the stand foot component reliably engage with and stop at the concave portions of the stand foot body. Accordingly, the stand foot component may be reliably stored or held.

An electrical device of the invention includes an electrical device body, a stand foot component and a resilient member. The electrical device body has at least one stand foot holder. The stand foot holder has two opposite sides each formed with a first pivotal portion. The stand foot holder further has a first slide-connecting portion between the first pivotal portions. At least one concave portion is formed in the first slide-connecting portion. The stand foot component is mounted in the stand foot holder and has two opposite sides each formed with a second pivotal portion pivotally connected with the first pivotal portion. A second slide-connecting portion, which may slide relative to the first slide-connecting portion, is formed between the second pivotal portions. A convex portion is formed in the second slide-connecting portion. When the stand foot component is held in the stand foot holder, the convex portion sinks into the concave portion. The resilient member is mounted between one of the first pivotal portions and its corresponding second pivotal portion. When the stand foot component is pivotally rotated relative to the electrical device body, the convex portion of the stand foot component is exposed from at least one concave portion, the stand foot component slides under an elastic force of the resilient member, and the convex portion of the stand foot component is stopped at one side edge of the first slide-connecting portion, so that the stand foot component may stand up.

In addition, a stand foot for an electrical device includes a stand foot body, a stand foot component and a resilient member. The stand foot body has a stand foot holder, which has two opposite sides each formed with a first pivotal portion. The stand foot holder further has a first slide-connecting portion between the first pivotal portions. At least one concave portion is formed in the first slide-connecting portion. The stand foot component is mounted in the stand foot holder and has two opposite sides each formed with a second pivotal portion pivotally connected with the first pivotal portion. A second slide-connecting portion, which may slide relative to the first slide-connecting portion, is formed between the second pivotal portions. A convex portion is formed in the second slide-connecting portion. When the stand foot component is held in the stand foot holder, the convex portion sinks into the concave portion. The resilient member is mounted between one of the first pivotal portions and its corresponding second pivotal portion. When the stand foot component is pivotally rotated relative to the stand foot body, the convex portion of the stand foot component is exposed from the concave portion, the stand foot component slides under an elastic force of the resilient member, and the convex portion of the stand foot component is stopped at one side edge of the first slide-connecting portion, so that the stand foot component may stand up.

DETAILED DESCRIPTION OF THE INVENTION

The electrical device according to a preferred embodiment of the invention will be described with reference to FIGS. 3A to 5.

Figure 1:
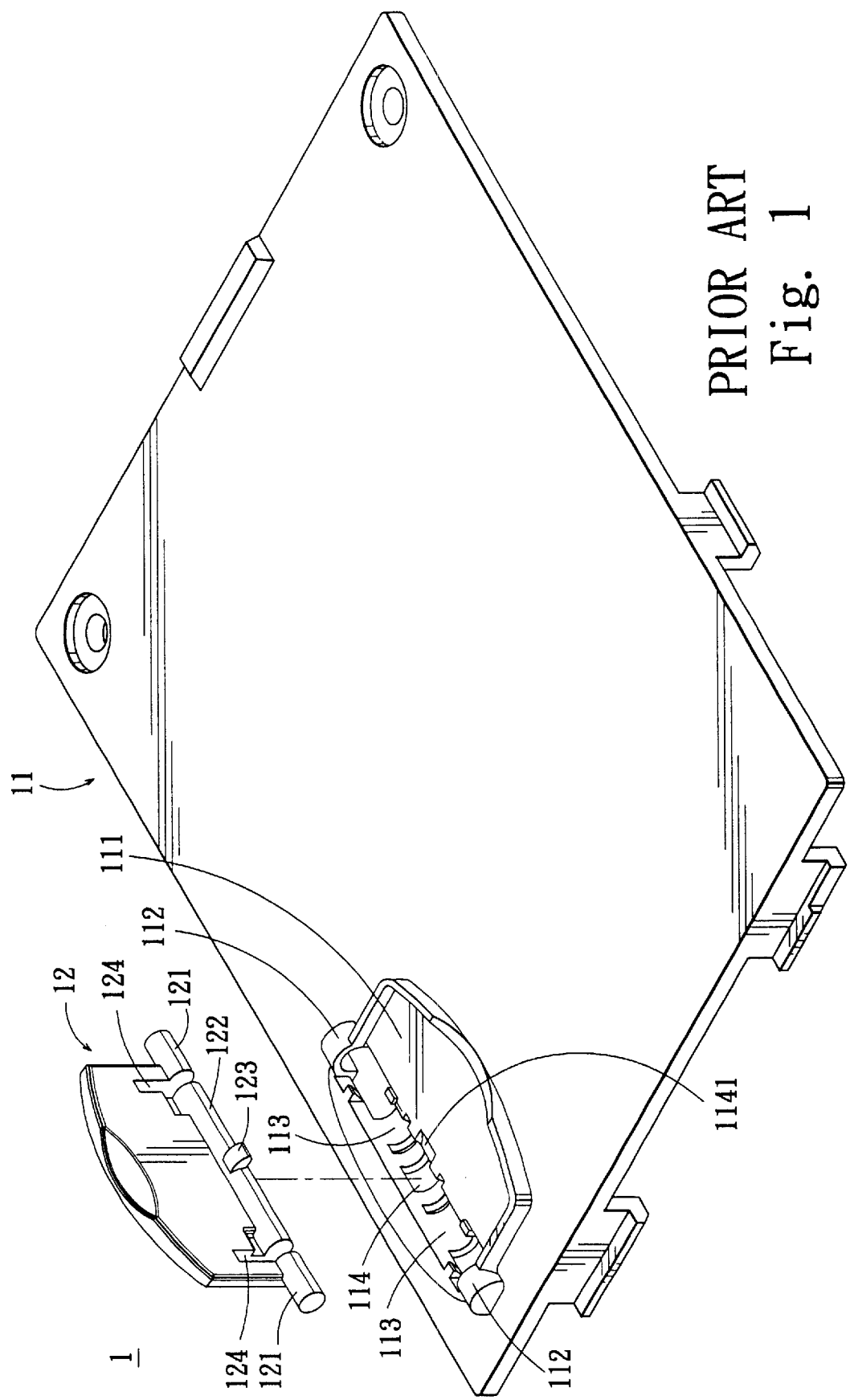
FIG. 1 is an exploded and schematic illustration showing a conventional stand for an electrical device.
Figure 2:
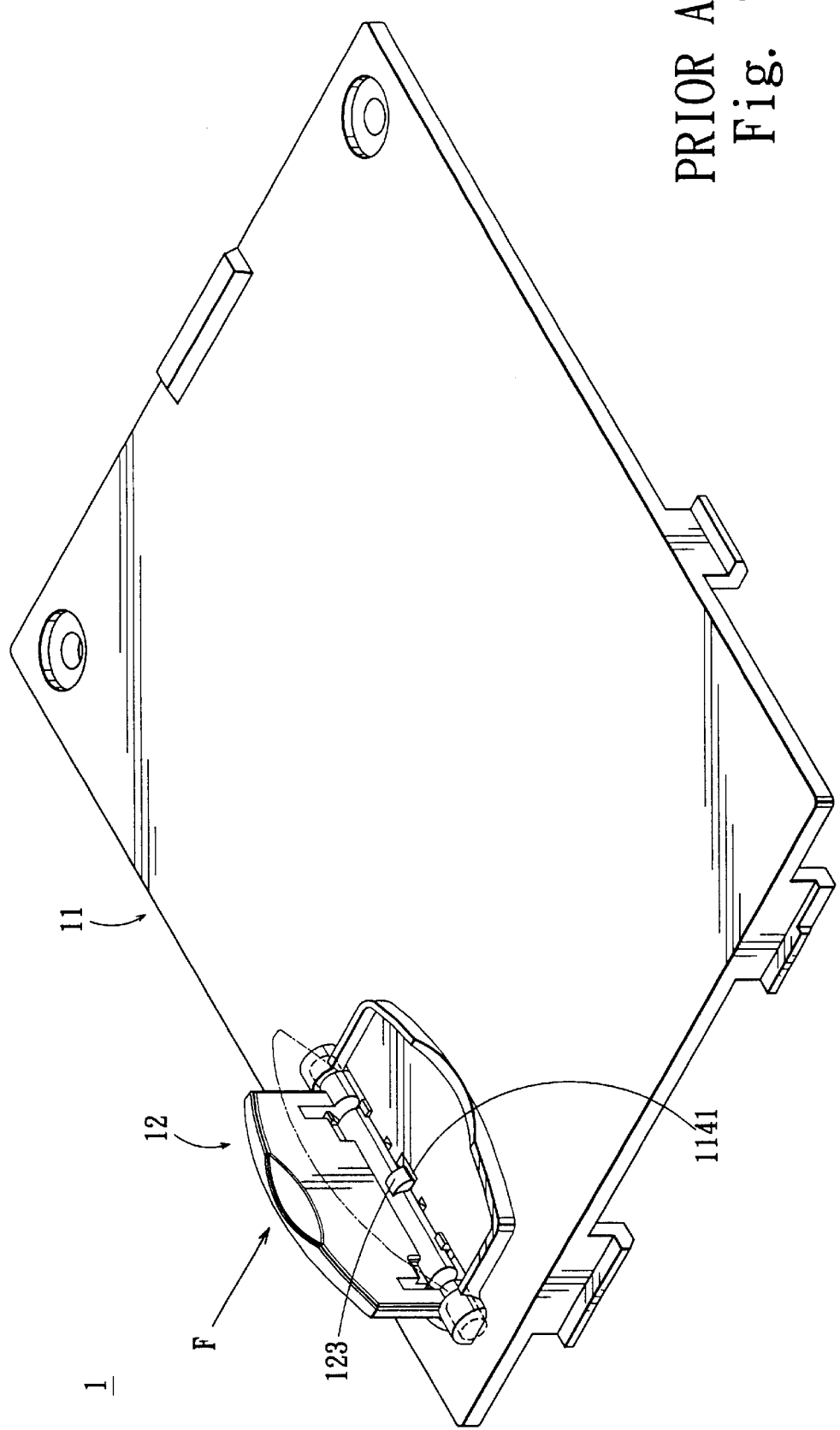
FIG. 2 is a combinational and schematic illustration showing the conventional stand foot for the electrical device.
Figure 3A:
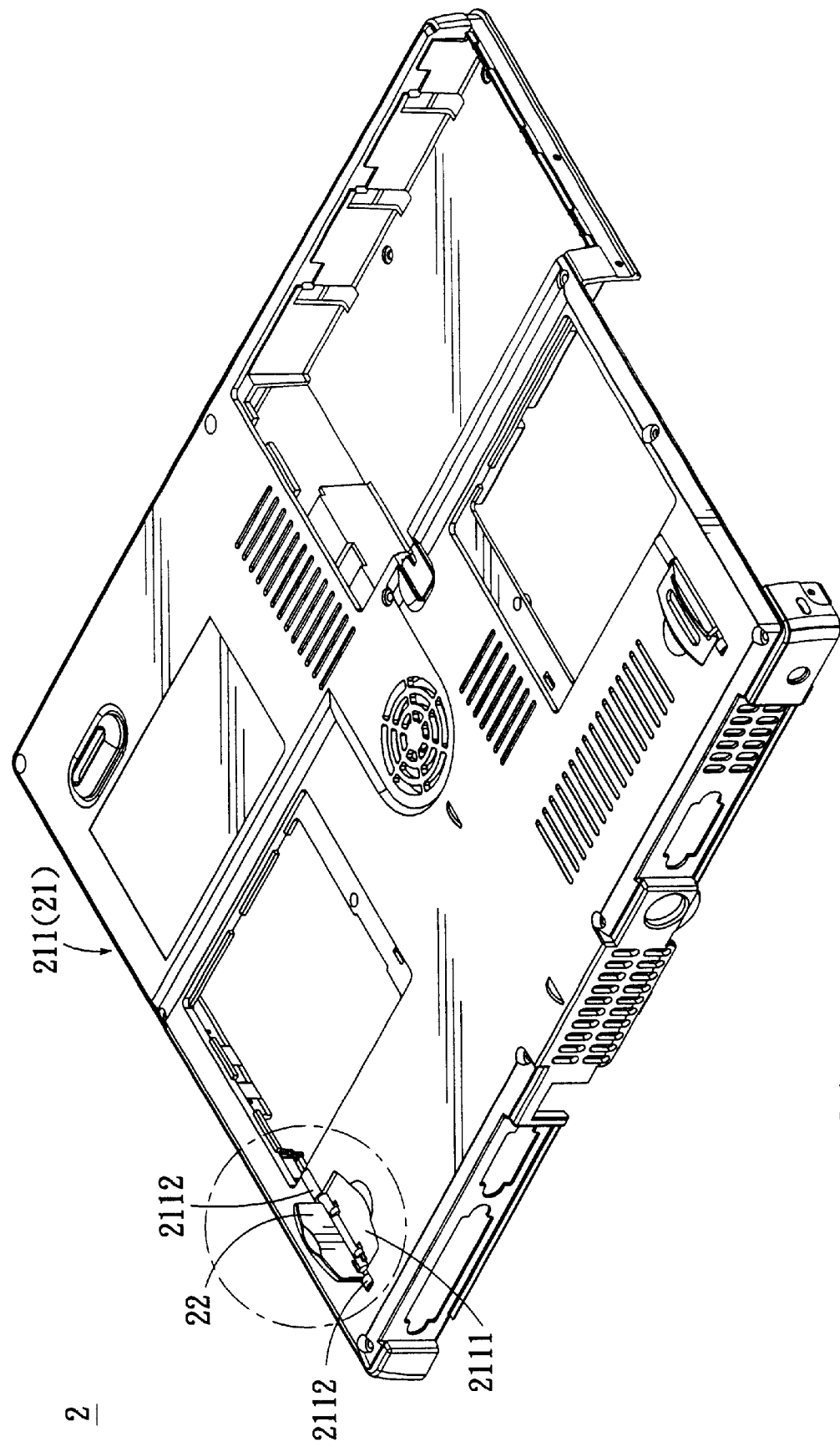
FIG. 3A is a pictorial view showing the main portion of the electrical device of the invention.
Figure 3B:
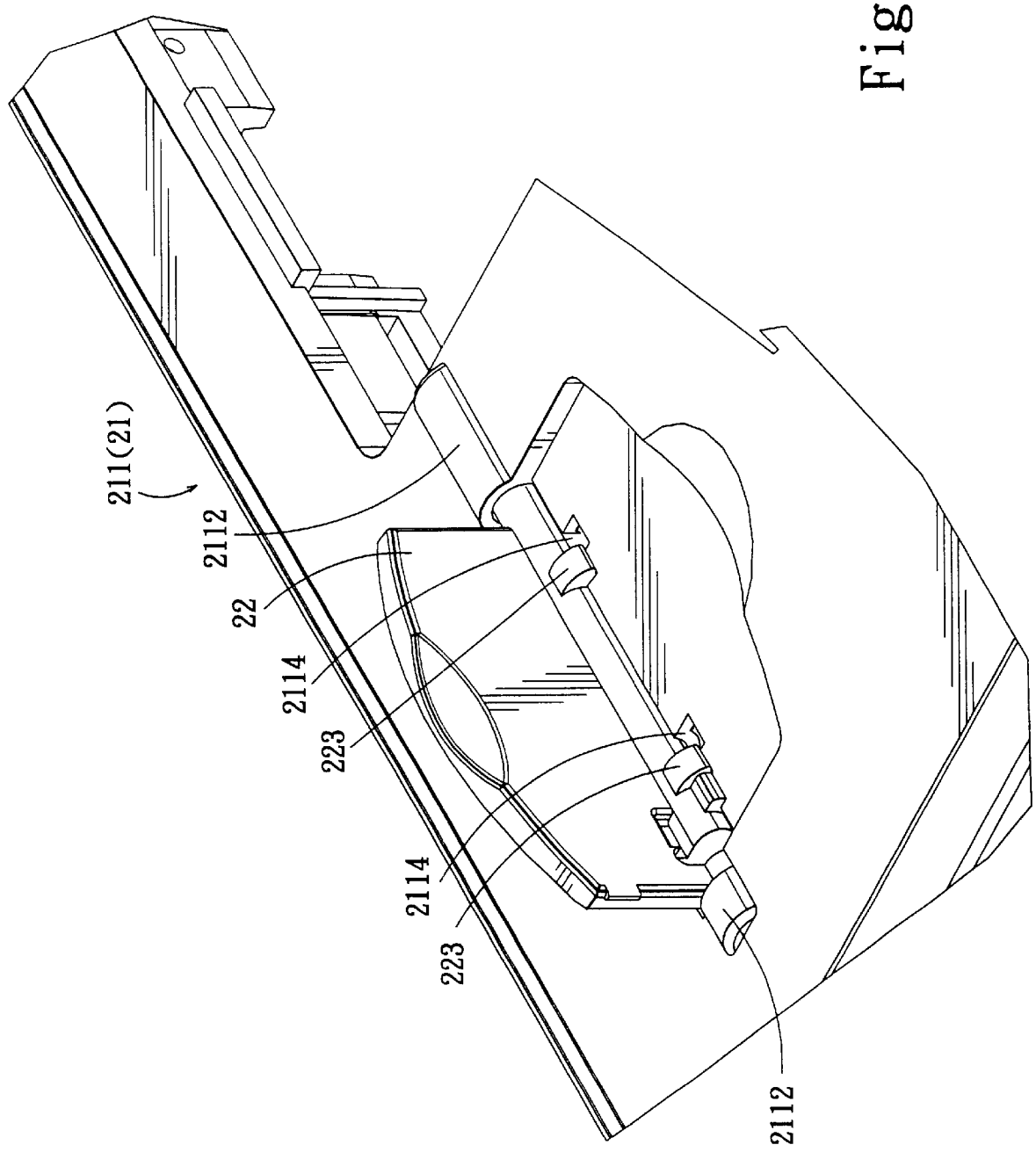
FIG. 3B is a partially enlarged view showing the electrical device of FIG. 3A.

Referring to FIGS. 3A and 3B, an electrical device 2 according to a preferred embodiment of the invention includes an electrical device body 21, a stand foot component 22 and a resilient member 23.

Figure 4:
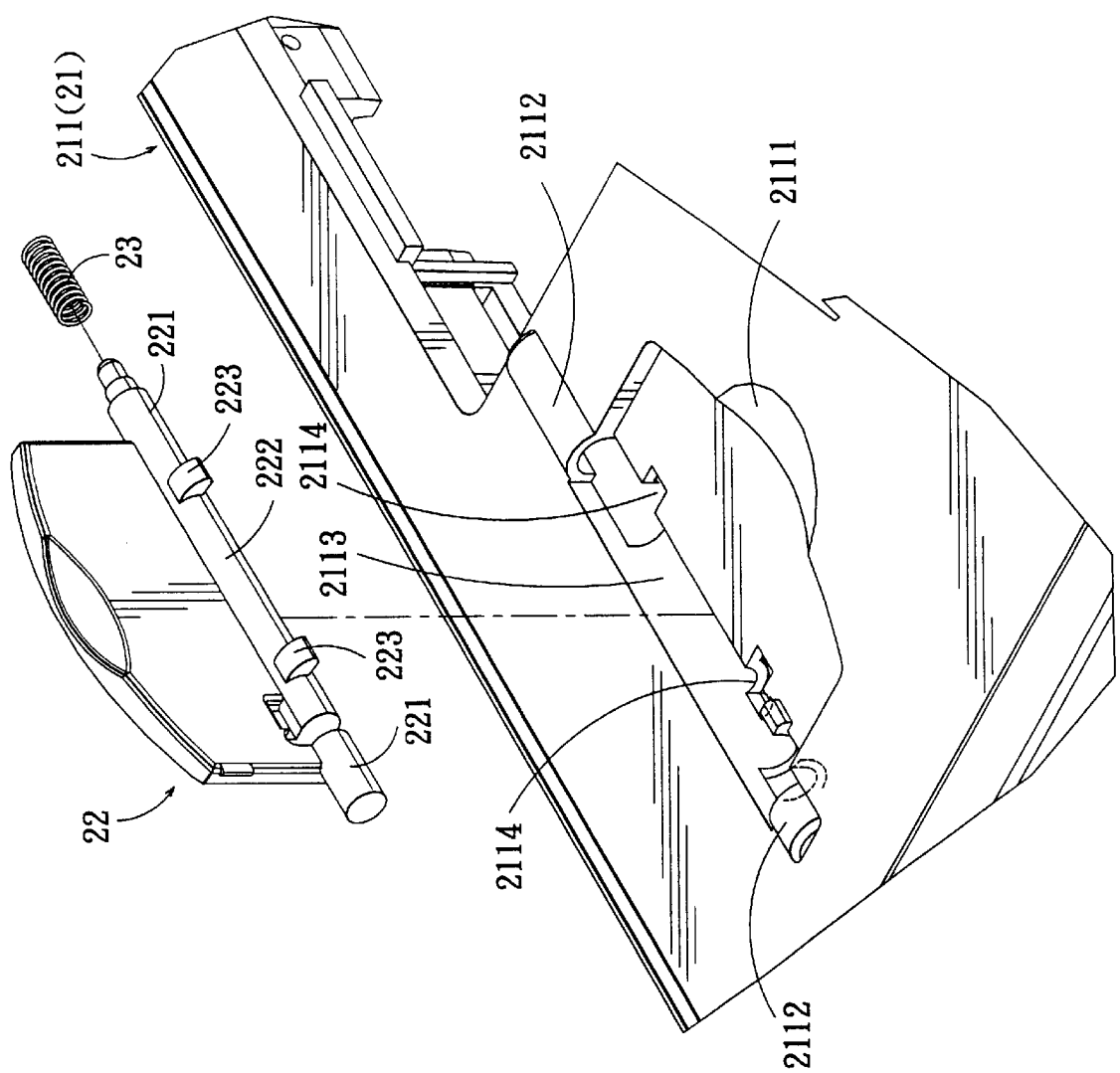
FIG. 4 is a partially exploded and schematic illustration showing the electrical device of FIG. 3B.

In this embodiment, the electrical device body 21 includes a first housing 211 and a second housing (not shown), both of which are the housings of electrical devices such as notebook computers. The first housing 211 is formed with a stand foot holder 2111 having two opposite sides each formed with a first pivotal portion 2112. As shown in FIG. 3B or FIG. 4, a first slide-connecting portion 2113 is formed between the first pivotal portions 2112, 2112. Two concave portions 2114, 2114 are formed in the first slide-connecting portion 2113. In this embodiment, the first pivotal portions 2112, 2112 may be pivotal slots. The stand foot holder 2111 may also be formed in the second housing of another electrical device body.

Figure 5A:
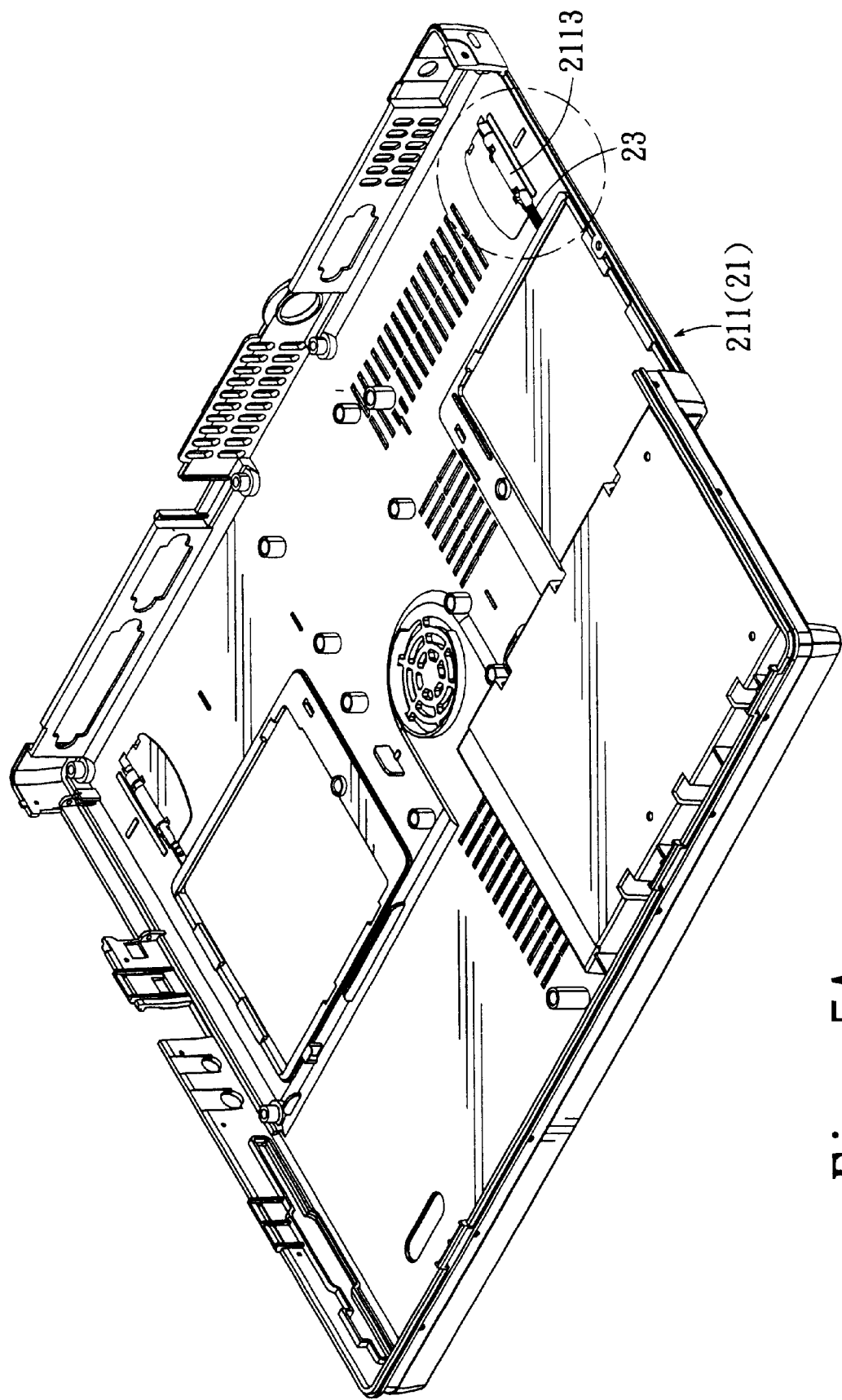
FIG. 5A is another pictorial view showing the electrical device of FIG. 3A.
Figure 5B:
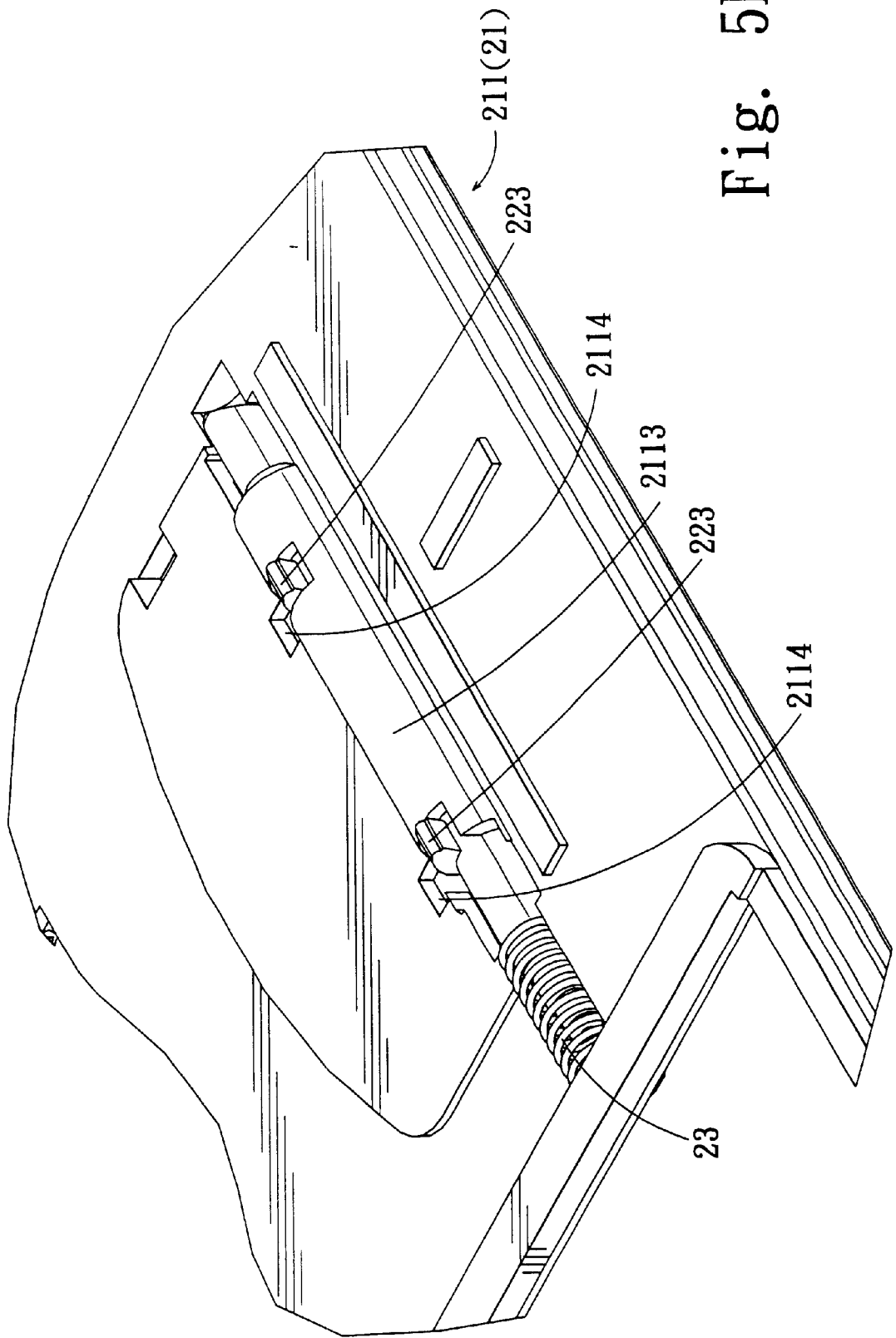
FIG. 5B is a partially enlarged view showing the electrical device of FIG. 5A.

The stand foot component 22 is mounted in the stand foot holder 2111 and has two opposite sides each formed with a second pivotal portion 221. In this embodiment, the second pivotal portions 221, 221 are pivotal axes. The second pivotal portions 221, 221 are pivotally connected with the first pivotal portions 2112, respectively. A second slide-connecting portion 222, which may slide relative to the first slide-connecting portion 2113 and is formed with two convex portions 223, 223, is formed between the second pivotal portions 221, 221. As shown in FIGS. 5A and 5B, when the stand foot component 22 is held within the stand foot holder 2111, the convex portions 223, 223 may sink into the concave portions 2114, 2114.

The resilient member 23 is mounted between one of the first pivotal portions 2112 and its corresponding second pivotal portion 221. In this embodiment, the resilient member 23 is a spring, which is fit into the second pivotal portion 221 and is positioned within the first pivotal portion 2112. When the stand foot component 22 is pivotally rotated relative to the first housing 211, the convex portions 223 of the stand foot component 22 are exposed from the concave portions 2114, respectively. In addition, the stand foot component 22 slides under the elastic force of the resilient member 23. Accordingly, the convex portions 223 of the stand foot component 22 are stopped at the side edges of the first slide-connecting portion 2113 so that the stand foot component may stand up (as shown in FIG. 3B).

It should be noted that, although the above-mentioned first pivotal portions 2112, 2112 and second pivotal portions 221, 221 are pivotal slots and pivotal axes, respectively, they might be pivotal axes and pivotal slots, respectively. In this case, the resilient member 23 is fit into the first pivotal portions 2112 (not shown).

In summary, the electrical device of the invention utilizes the elastic force supplied from the resilient member 23 to make the stand foot component 22 slide under the elastic force of the resilient member 23. Consequently, the convex portions formed on the stand foot component 22 may reliably function as stoppers so that the stand foot component may reliably stand up. In addition, the electrical device of the invention functions by compressing the resilient member 23 to make the convex portions of the stand foot component 22 reliably engage with and stop at the concave portions 2114 of the electrical device body. Accordingly, the stand foot component 22 may be reliably stored or held.

A stand foot for an electrical device according to a preferred embodiment of the invention will be described with reference to FIG. 6. The main structure of the stand foot for the electrical device in this embodiment is the same as that of the above-mentioned embodiment. For the sake of simplicity, the same reference numbers denote the same elements, and the same description will be omitted.

Figure 6:
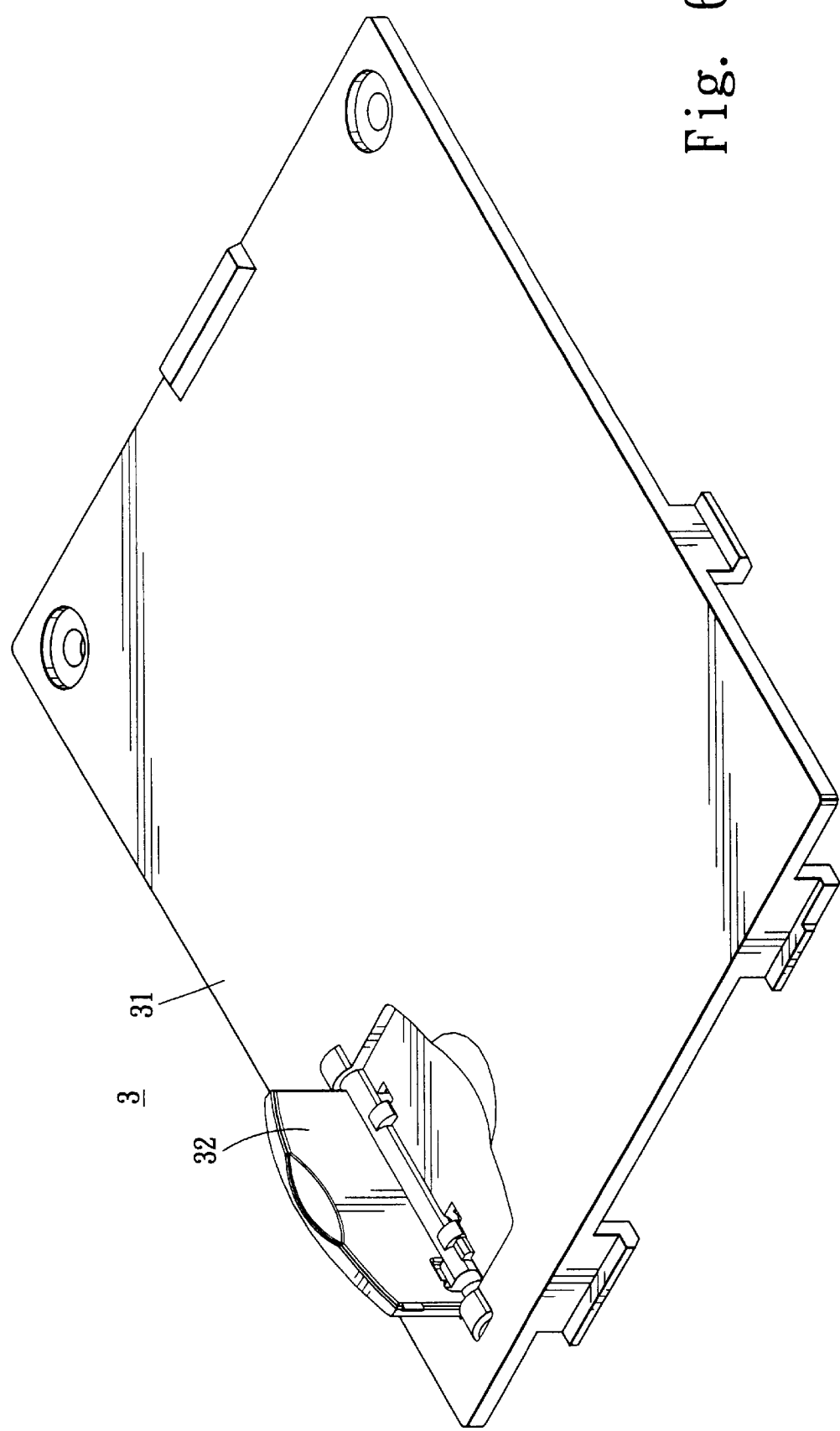
FIG. 6 is a combinational and schematic illustration showing the stand foot for the electrical device of the invention.

Referring to FIG. 6, a stand foot 3 for an electrical device according to the preferred embodiment of the invention includes a stand foot body 31, a stand foot component 32 and a resilient member (not shown).

In this embodiment, the stand foot body 31 is a battery cap of a notebook computer, and the like. The structures of the stand foot holder of the stand foot body 31 and the like are the same as those of the stand foot holder in the previous embodiment. In addition, the structures of the stand foot component 32 and the resilient member are also the same as the stand foot component 22 and the resilient member 23 of the previous embodiment of the invention. Of course, the operation of the stand foot 3 for the electrical device in this embodiment is also the same as that of the electrical device of the previous embodiment.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. An electrical device, comprising:
   an electrical device body having at least a stand foot holder, the stand foot holder having two first pivotal portions and a first slide-connecting portion, the first pivotal portions being respectively provided at two opposite sides of the stand foot holder, the first slide-connecting portion being located between the first pivotal portions, and at least a concave portion being formed in the first slide-connecting portion;
   at least a stand foot component mounted in the stand foot holder, the stand foot component having two second pivotal portions and a second slide-connecting portion, the second pivotal portions being respectively provided at two opposite sides of the stand foot component for pivotally connecting with the first pivotal portions, the second slide-connecting portion, which slides relative to the first slide-connecting portion, being located between the second pivotal portions, and at least a convex portion being formed in the second slide-connecting portion, wherein when the stand foot component is held in the stand foot holder, the convex portion sinks into the concave portion; and
   a resilient member mounted between one of the first pivotal portions and its corresponding second pivotal portion, wherein when the stand foot component is pivotally rotated relative to the electrical device body, the convex portion of the stand foot component is exposed out of the concave portion, the stand foot component slides under an elastic force from the resilient member, and the convex portion of the stand foot component is stopped at one side edge of the first slide-connecting portion so as to stand the stand foot component.

2. The electrical device according to claim 1, wherein the electrical device body comprises a first housing and a second housing.

3. The electrical device according to claim 2, wherein the stand foot holder is formed in the first housing.

4. The electrical device according to claim 2, wherein the stand foot holder is formed in the second housing.

5. The electrical device according to claim 1, wherein the resilient member is a spring.

6. The electrical device according to claim 1, wherein the first pivotal portions are pivotal slots.

7. The electrical device according to claim 6, wherein the second pivotal portions are pivotal axes.

8. The electrical device according to claim 7, wherein the resilient member is fit into one of the second pivotal portions.

9. The electrical device according to claim 1, wherein the first pivotal portions are pivotal axes.

10. The electrical device according to claim 9, wherein the second pivotal portions are pivotal slots.

11. The electrical device according to claim 9, wherein the resilient member is fit into one of the first pivotal portions.

12. A stand foot for an electrical device, comprising:
    a stand foot body having a stand foot holder, the stand foot holder having two first pivotal portions and a first slide-connecting portion, the first pivotal portions being respectively provided at two opposite sides of the stand foot holder, the first slide-connecting portion being located between the first pivotal portions, and at least a concave portion being formed in the first slide-connecting portion;
    a stand foot component mounted in the stand foot holder, the stand foot component having two second pivotal portions and a second slide-connecting portion, the second pivotal portions being respectively provided at two opposite sides of the stand foot component for pivotally connected with the first pivotal portions, a second slide-connecting portion, which slides relative to the first slide-connecting portion, being located between the second pivotal portions, and at least a convex portion being formed in the second slide-connecting portion, wherein when the stand foot component is held in the stand foot holder, the convex portion sinks into the concave portion; and
    a resilient member mounted between one of the first pivotal portions and its corresponding second pivotal portion, wherein when the stand foot component is pivotally rotated relative to the stand foot body, the convex portion of the stand foot component is exposed out of the concave portion, the stand foot component slides under an elastic force from the resilient member, and the convex portion of the stand foot component is stopped at one side edge of the first slide-connecting portion so as to stand the stand foot component.

13. The stand foot according to claim 12, wherein the resilient member is a spring.

14. The stand foot according to claim 12, wherein the stand foot body is assembled on an electrical device.

15. The stand foot according to claim 12, wherein the first pivotal portions are pivotal slots.

16. The stand foot according to claim 15, wherein the second pivotal portions are pivotal axes.

17. The stand foot according to claim 16, wherein the resilient member is fit into one of the second pivotal portions.

18. The stand foot according to claim 12, wherein the first pivotal portions are pivotal axes.

19. The stand foot according to claim 18, wherein the second pivotal portions are pivotal slots.

20. The stand foot according to claim 18, wherein the resilient member is fit into one of the first pivotal portions.

* * * * *